(12) United States Patent
Hauttecoeur

(10) Patent No.: US 12,261,059 B2
(45) Date of Patent: Mar. 25, 2025

(54) MANUFACTURING METHOD OF RF COMPONENTS

(71) Applicant: STMICROELECTRONICS (TOURS) SAS, Tours (FR)

(72) Inventor: Patrick Hauttecoeur, Saint Cyr sur Loire (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 0 days.

(21) Appl. No.: 17/880,473

(22) Filed: Aug. 3, 2022

(65) Prior Publication Data
US 2023/0048614 A1 Feb. 16, 2023

(30) Foreign Application Priority Data

Aug. 12, 2021 (FR) ........................................ 2108655

(51) Int. Cl.
*H01L 21/32* (2006.01)
*H01L 21/02* (2006.01)
*H01L 21/324* (2006.01)

(52) U.S. Cl.
CPC ...... *H01L 21/3247* (2013.01); *H01L 21/0231* (2013.01); *H01L 21/02323* (2013.01); *H01L 21/02625* (2013.01)

(58) Field of Classification Search
CPC ............. H01L 21/3247; H01L 21/0231; H01L 21/02323; H01L 21/02625; H01L 21/3221; H01L 21/7624; H01L 21/268; H01L 21/02002
See application file for complete search history.

(56) References Cited

U.S. PATENT DOCUMENTS

| | | | |
|---|---|---|---|
| 8,536,021 B2 * | 9/2013 | Arriagada | H01L 27/1203 438/455 |
| 10,600,888 B2 * | 3/2020 | Or-Bach | H01L 29/0673 |
| 11,081,407 B2 * | 8/2021 | Rapoport | H01L 22/20 |
| 11,088,050 B2 * | 8/2021 | Or-Bach | H01L 29/66704 |
| 2003/0218171 A1 | 11/2003 | Isobe et al. | |

(Continued)

FOREIGN PATENT DOCUMENTS

| FR | 3083917 A1 * | 1/2020 | ............. H01L 21/20 |
|---|---|---|---|
| JP | 2018107428 A * | 7/2018 | ............. C30B 29/06 |

(Continued)

OTHER PUBLICATIONS

Ali, "Substrate-Related Rf Performance of Trap-Rich High-Resistivity SOI Wafers," Doctoral Thesis, Université catholique de Louvain, Université de Tunis Elmanar, Jun. 2014. (214 pages).

(Continued)

*Primary Examiner* — Mohammed Shamsuzzaman
(74) *Attorney, Agent, or Firm* — Seed IP Law Group LLP

(57) ABSTRACT

The present description concerns a method of manufacturing a device comprising at least one radio frequency component on a semiconductor substrate comprising: a) a laser anneal of a first thickness of the substrate on the upper surface side of the substrate; b) the forming of an insulating layer on the upper surface of the substrate; and c) the forming of said at least one radio frequency component on the insulating layer.

20 Claims, 2 Drawing Sheets

(56) References Cited

U.S. PATENT DOCUMENTS

| | | | |
|---|---|---|---|
| 2009/0286382 A1* | 11/2009 | Huff | H01L 24/83 |
| | | | 438/455 |
| 2015/0145105 A1* | 5/2015 | Haapalinna | H01L 29/04 |
| | | | 257/617 |
| 2018/0130698 A1* | 5/2018 | Kononchuk | H01L 21/02123 |
| 2019/0057868 A1* | 2/2019 | Englekirk | H01L 29/78603 |
| 2020/0058566 A1* | 2/2020 | Rapoport | H01L 22/14 |
| 2020/0161336 A1 | 5/2020 | Lamy et al. | |
| 2021/0183690 A1 | 6/2021 | Reboh et al. | |

FOREIGN PATENT DOCUMENTS

| | | | | |
|---|---|---|---|---|
| WO | WO-2010068542 A1 * | 6/2010 | | H01L 21/0223 |
| WO | WO-2021213410 A1 * | 10/2021 | | H01L 21/0223 |

OTHER PUBLICATIONS

Monflier, "Etude des défauts induits par recuit laser excimère dans le silicium," Doctoral Thesis, Université Paul Sabatier—Toulouse III, Mar. 19, 2019. (with English Abstract) (145 pages).

* cited by examiner

MANUFACTURING METHOD OF RF COMPONENTS

TECHNICAL FIELD

The present disclosure generally concerns the field of electronic components such as radio frequency components.

DESCRIPTION OF THE RELATED ART

Known radio frequency components comprise active components such as amplifiers, mixers, and data converters, and passive components such as capacitors, inductances, and antennas.

BRIEF SUMMARY

There is a need to improve known radio frequency components and their manufacturing methods.

An embodiment provides a method of manufacturing a device comprising at least one radio frequency component on a semiconductor substrate comprising:
 a) a laser anneal of a first thickness of the substrate on the upper surface side of the substrate;
 b) the forming of an insulating layer on the upper surface of the substrate; and
 c) the forming of said at least one radio frequency component on the insulating layer.

According to an embodiment, the substrate has a resistance greater than 3 kΩ.

According to an embodiment, the method comprises, before step a), a step of forming of an oxide layer on the upper surface side of the substrate.

According to an embodiment, the power of the laser during step a) is in the order of 4 $J/cm^2$.

According to an embodiment, the substrate is made of silicon or of gallium nitride.

According to an embodiment, the laser has a wavelength in the range from 300 nm to 700 nm.

According to an embodiment, during step a), the first thickness of the substrate is melted.

According to an embodiment, step a) is followed by a step of cooling of the substrate.

According to an embodiment, the first thickness is in the range from 0.5 μm to 2 μm, for example, in the order of 1 μm.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the forming of the radio frequency components has not been detailed, the forming of these components being within the abilities of those skilled in the art based on the indications of the present description. Further, the applications where such components are likely to be used have not been detailed, the described embodiments being compatible with usual applications of radio frequency components.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front," "back," "top," "bottom," "left," "right," etc., or to relative positional qualifiers, such as the terms "above," "below," "upper," "lower," etc., or to qualifiers of orientation, such as "horizontal," "vertical," etc., reference is made to the orientation shown in the figures.

Unless specified otherwise, the expressions "around," "approximately," "substantially" and "in the order of" signify within 10%, and preferably within 5%.

The term radio frequency components generally designates components having an operating frequency in the range from 3 kHz to 30 GHz.

Figure 1:
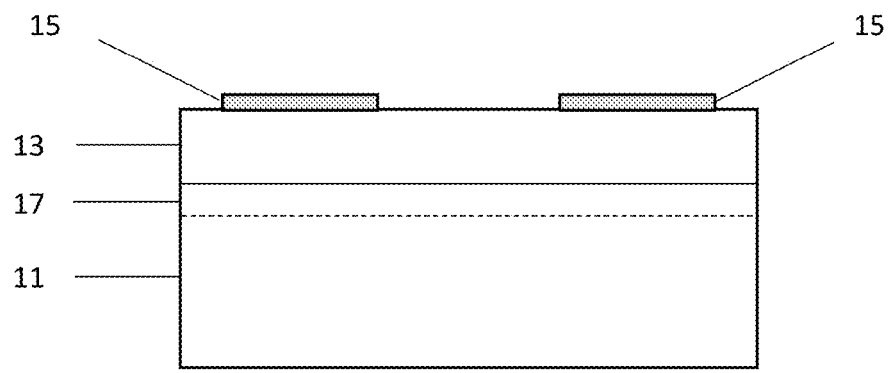
FIG. 1 is a cross-section view illustrating an example of a device comprising radio frequency components.

FIG. 1 is a cross-section view illustrating an example of a device comprising radio frequency components 15.

The device illustrated in FIG. 1 comprises a semiconductor substrate 11 coated with a passivation layer 13 having radio frequency components 15 arranged thereon. Passivation layer 13 is for example in contact, by its lower surface, with the upper surface of semiconductor substrate 11. Passivation layer 13 for example continuously extends over the entire surface of semiconductor substrate 11. In the example illustrated in FIG. 1, the device comprises two radio frequency components 15. In practice, the device may comprise any number of radio frequency components 15, for example, a single radio frequency component 15 or more than two radio frequency components 15.

Substrate 11 for example corresponds to a semiconductor wafer or to a piece of a semiconductor wafer. Substrate 11 is for example made of silicon or of gallium nitride (GaN). As an example, substrate 11 is a material of high resistivity or resistance, for example, a material having a resistance greater than 3 kΩ. Substrate 11 is for example made of high-resistivity or high-resistance silicon. Substrate 11 may be a solid semiconductor substrate, for example, a solid high-resistivity or high-resistance silicon substrate or a substrate of SOI (Semiconductor on Insulator) type, for example, a substrate made of high-resistivity or high-resistance silicon on insulator.

Passivation layer 13 is an electrically-insulating layer. Passivation layer 13 is for example made of silicon dioxide.

In practice, due to the high operating frequencies of radio frequency components 15, induced currents may appear in an upper portion 17 of substrate 11, called parasitic surface conduction (PSC) area. These induced currents may disturb the proper operation of radio frequency components 15 and degrade their performance.

According to an embodiment, it is provided to form a trap-rich layer in an upper portion of substrate 11. Indeed, the presence of traps enables to degrade the mobility of electrons and of holes, which enables to decrease induced currents, which cause the degradation of the performance of RF components.

It has already been provided to form a trap-rich surface layer in a semiconductor substrate by various techniques and particularly by laser texturing, by chemical etching, by electronic irradiation, by the forming of nanocavities, by thermal stress, or by mechanical texturing. To increase the trap density, a plurality of these techniques may for example be combined. It would be desirable to be able to have an alternative technique, simpler to implement, to form a trap-rich surface layer in a semiconductor substrate intended to support radio frequency components.

In the embodiment described hereafter, it is provided to create a trap-rich layer by using a laser anneal technique. This technique, currently used to activate or propagate dopants in a semiconductor layer, is in this embodiment used in an unusual way to intentionally create defects in a semiconductor layer.

FIGS. 2 to 6 are cross-section views illustrating successive steps of an example of a method of manufacturing a device comprising radio frequency components according to an embodiment.

Figure 2:
FIG. 2 is a cross-section view illustrating a structure obtained at the end of a step of an example of a method of manufacturing a device comprising radio frequency components according to an embodiment.

FIG. 2 illustrates an initial structure formed of a semiconductor substrate 21. Substrate 21 is for example a wafer of a semiconductor material. As an example, substrate 21 is made of silicon or of gallium nitride. As an example, substrate 21 is made of a material of high resistivity or high resistance. Substrate 21 may be a solid semiconductor substrate, or a SOI-type substrate.

Substrate 21 for example has a thickness in the range from 300 μm to 800 μm, for example, in the order of 725 μm.

As an example, substrate 21 is not doped or is very lightly doped. The dopant concentration in substrate 21 is for example smaller than approximately $10^{12}$ atoms/cm$^3$ for phosphorus atoms and, for example, smaller than approximately $4.10^{12}$ atoms/cm$^3$ for boron atoms. As an example, the dopants present in substrate 21 may be different from phosphorus and from boron and may be arsenic or antimony.

Figure 3:
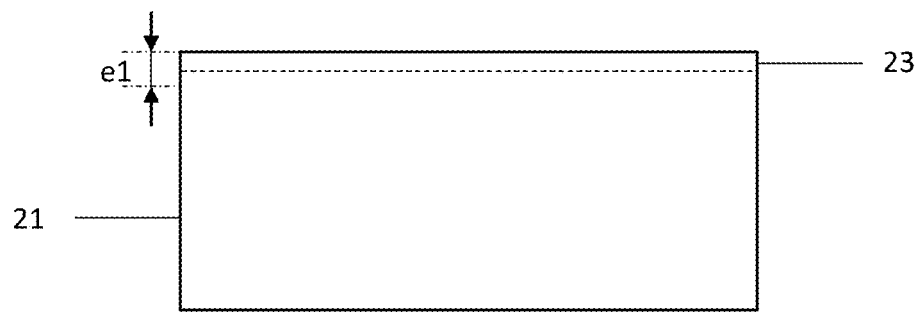
FIG. 3 is a cross-section view illustrating a structure obtained at the end of another step of an example of a method of manufacturing a device comprising radio frequency components according to an embodiment.

FIG. 3 illustrates the structure obtained at the end of a step of forming of an insulating layer 23 on the upper surface side of substrate 21.

As an example, layer 23 is an oxide layer.

In the example illustrated in FIG. 3, an upper portion of substrate 21 is oxidized to form layer 23. Layer 23 then corresponds to an upper portion of substrate 21. Layer 23 has the same chemical composition as substrate 21, with the difference that it comprises a greater oxygen atom concentration. In this example, layer 23 has a thickness e1 in the range from 5 nm to 30 nm, for example, in the range from 15 nm to 20 nm.

As an example, layer 23 is formed by thermal or chemical oxidation of an upper portion of substrate 21. As an example, layer 23 is formed during a cleaning of the upper surface of substrate 21 in a mixture of sulfuric acid and of hydrogen peroxide. As a variant, layer 23 is a layer of native oxide present at the surface of substrate 21.

Figure 4:
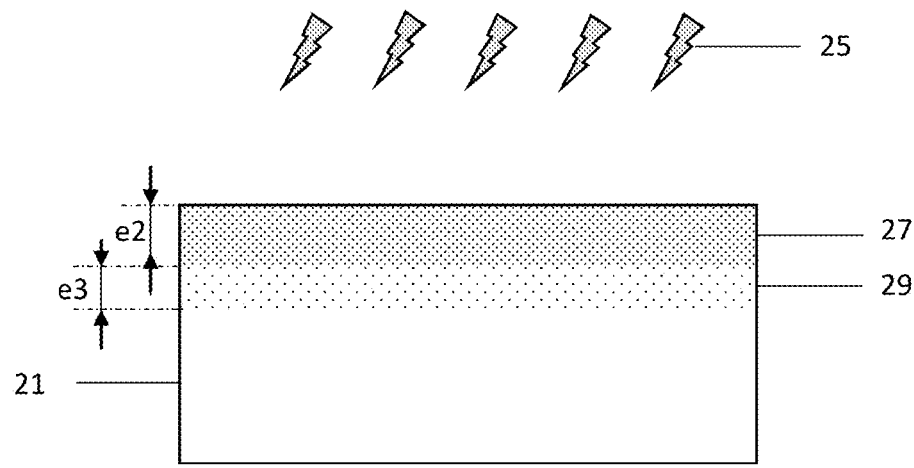
FIG. 4 is a cross-section view illustrating a structure obtained at the end of another step of an example of a method of manufacturing a device comprising radio frequency components according to an embodiment.

FIG. 4 illustrates the structure obtained at the end of a step of laser anneal from the upper surface of the structure illustrated in FIG. 3.

The laser anneal step illustrated in relation with FIG. 3 comprises two successive steps.

During a first step, the upper surface of the structure is exposed to the radiation of a laser 25, for example, a pulsed laser. As an example, the upper surface of the structure is exposed to the radiations of layer 25 to melt an upper portion of the semiconductor material of substrate 21. Reference 27 designates an upper layer of the structure of thickness e2, melted under the effect of the laser radiation. Thickness e2 particularly depends on the power of laser 25, on the wavelength of laser 25, on the material of substrate 21 and, in the case of a pulsed laser, on the duration and on the frequency of the pulses of laser 25. As an example, the power of laser 25 is in the order of 4 J/cm$^2$. The wavelength of laser 25 may be selected according to the material of substrate 21. It is for example in the range from 300 nm to 700 nm. As an example, for a silicon substrate 21, the wavelength of laser 25 may be smaller than 500 nm and, for a gallium nitride substrate 21, the wavelength of laser 25 may be smaller than 400 nm. Thickness e2 is for example in the range from 0.5 μm to 2 μm, for example, in the order of 1 μm. As an example, during this first step, the oxygen atoms present in oxide layer 23 diffuse into layer 27, it is then said that layer 23 is a source of oxygen atoms which diffuse into layer 27. Layer 27 thus comprises an oxygen atom concentration greater than the oxygen atom concentration in the lower portion of substrate 21.

During a second step, the structure and more particularly the upper layer 27 of the structure is cooled, preferably rapidly. The cooling speed is preferably greater than the crystallization speed of the material of substrate 21 so that layer 27 does not recrystallize and remains in an amorphous state.

At the end of the laser anneal step, substrate 21 has, in its upper portion 27, defects resulting from the incorporation of oxygen atoms (particularly originating from oxide layer 23 and from the atmosphere of the anneal chamber) into the material of the substrate. As an example, in the case of a silicon substrate, the defects formed in layer 27 are in the form of complexes between carbon atoms and silicon atoms and of complexes between carbon atoms and oxygen atoms. These defects are adapted to trapping possible charge carriers present in layer 27.

The density of defects generated in the upper portion 27 of substrate 21 during the anneal step particularly depends on the heating speed and on the cooling speed of substrate 21. In particular, the higher the heating speed and the faster the cooling, the larger the defect density will be.

During the laser anneal step, another layer 29 of substrate 21, located under and in contact with melted layer 27, also undergoes transformations. In particular, during the cooling, crystal structure defects of the structure tend to propagate across the thickness of substrate 21 under layer 27. Unlike layer 27, the layer 29 of substrate 21 does not melt and remains crystalline. Layer 29 extends in substrate 21 from the lower surface of portion 27 across a thickness e3. As an example, thickness e3 is in the range from 0.5 µm to 2 µm, for example, in the order of 1 µm. Layer 29 contains defects of void or gap type, adapted to trapping possible charge carriers present in layer 29.

As an example, the laser anneal step mentioned hereabove is performed full plate, that is, it is formed over the entire surface of substrate 21.

As a variant, the above-mentioned laser anneal step is performed locally at the surface of substrate 21. In this variant, the accuracy or resolution of the laser is for example in the order of a few micrometers.

In the example illustrated in FIG. 4, the laser anneal generates no texturing of the surface of substrate 21. In other words, the upper surface of substrate 21, and more particularly the upper surface of layer 27, is planar at the end of the laser anneal step.

Figure 5:
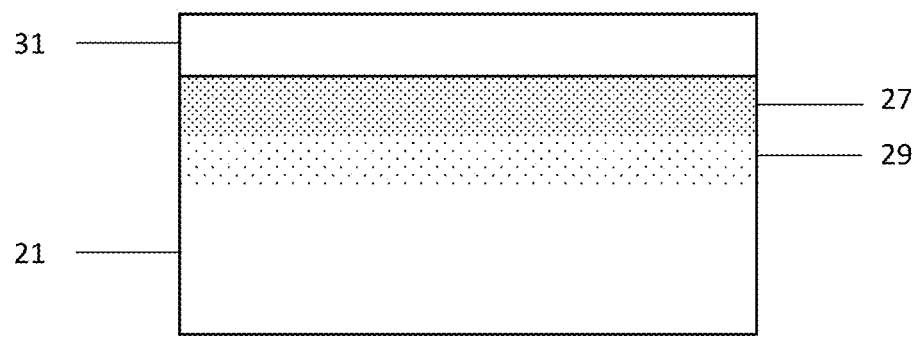
FIG. 5 is a cross-section view illustrating a structure obtained at the end of another step of an example of a method of manufacturing a device comprising radio frequency components according to an embodiment.

FIG. 5 illustrates the structure obtained at the end of a step of deposition of an electrically-insulating layer or passivation layer 31 at the surface of the structure illustrated in FIG. 4.

As an example, layer 31 is made of an oxide, for example, of silicon oxide.

As an example, layer 31 is deposited full plate at the surface of the device illustrated in FIG. 4, that is, it is deposited to integrally cover the upper surface of substrate 21. As an example, layer 31 has a thickness in the range from 0.5 µm to 2 µm, for example, in the order of 1.2 µm.

Figure 6:
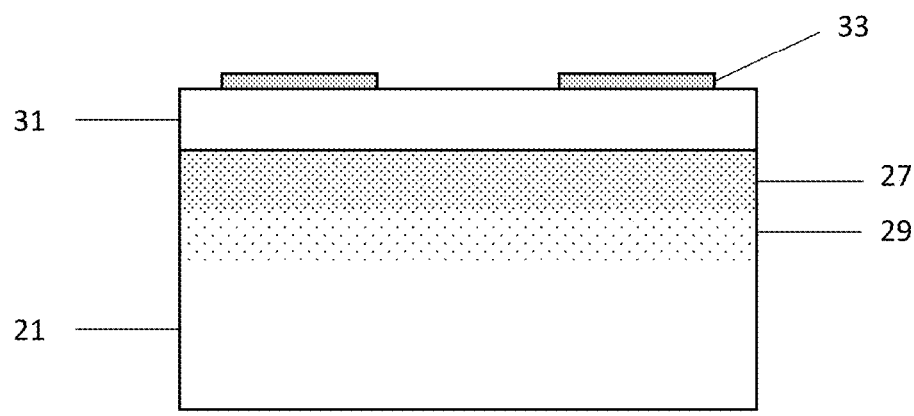
FIG. 6 is a cross-section view illustrating a structure obtained at the end of another step of an example of a method of manufacturing a device comprising radio frequency components according to an embodiment.

FIG. 6 illustrates the device obtained at the end of a step of forming of radio frequency components 33 on insulating layer 31.

In the example illustrated in FIG. 6, the device comprises two radio frequency components 33. In practice, the device may support any number of radio frequency components 33, for example, a single radio frequency component 33 or more than two radio frequency components 33.

As an example, radio frequency components 33 are passive components, for example, inductances or antennas. Radio frequency components 33 are for example made of a metallic material, for example, copper or aluminum.

As an example, radio frequency components 33 are configured to operate in a frequency range between a few kilohertz and a few gigahertz, for example, from 3 kHz to 30 GHz.

An advantage of the method described in relation with FIGS. 2 to 6 is that it enables, by a relatively simple to implement laser anneal technique, to form a trap-rich surface layer in a semiconductor substrate intended to support radio frequency components. The provided method enables, at a low cost, to obtain a high trap density and thus to significantly decrease parasitic currents induced in the substrate and thus to improve the performance of radio frequency components.

Various embodiments and variants have been described. Those skilled in the art will understand that certain features of these various embodiments and variants may be combined, and other variants will occur to those skilled in the art. In particular, the described embodiments are not limited to the examples of materials and of dimensions mentioned in the present disclosure.

Further, although only examples of high-resistivity or high-resistance substrates have been detailed hereabove, the described embodiments are not limited to this specific case.

Finally, the practical implementation of the described embodiments and variations is within the abilities of those skilled in the art based on the functional indications given hereabove.

A method of manufacturing a device may be summarized as including at least one radio frequency component (33) on a semiconductor substrate (21) comprising a) a laser anneal of a first thickness (27) of the substrate on the upper surface side of the substrate; b) the forming of an insulating layer (31) on the upper surface of the substrate; and c) the forming of said at least one radio frequency component on the insulating layer.

The substrate (21) may have a resistance greater than 3 kΩ.

The method may include, before step a), a step of forming of an oxide layer (23) on the upper surface side of the substrate (21).

The power of the laser during step a) is in the order of 4 J/cm$^2$.

The substrate (21) may be made of silicon or of gallium nitride.

The laser may have a wavelength in the range from 300 nm to 700 nm.

During step a), the first thickness (27) of the substrate (21) may be melted.

Step a) may be followed by a step of cooling of the substrate (21).

The first thickness (27) may be in the range from 0.5 µm to 2 µm, for example, in the order of 1 µm.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of forming a radio frequency device, comprising:
    forming an oxide layer at a surface of a substrate;
    forming a first defect layer of the substrate containing first defects of a first complex type between carbon atoms and first atoms and of a second complex type between carbon atoms and oxygen atoms, having a first thickness, and being present at the surface of the substrate by laser annealing the substrate with a laser, and forming a second defect layer of the substrate containing second defects of a void type different from the first complex type and the second complex type, having a second thickness, being present between the first defect layer and a first portion of the substrate, and being on the first portion of the substrate by the laser annealing of the substrate, and forming the first defect layer and the second defect layer by the laser annealing of the substrate includes:
    melting a second portion of the substrate at the surface of the substrate and on the first portion of the substrate by exposing the second portion of the substrate to the laser;
    cooling the second portion of the substrate and the first portion of the substrate, the cooling the second portion of the substrate and the first portion of the substrate including:

forming the first defect layer containing the first defects of the first complex type and the second complex type, being in an amorphous state, and being on the second defect layer; and forming the second defect layer containing the second defects of the void type, being in a crystalline state, and being present between the first defect layer and the first portion of the substrate, the second defect layer separating the first defect layer from the first portion of the substrate;

forming an insulating layer on the first defect layer; and forming the radio frequency component on the insulating layer, wherein:

the first and second thicknesses are in a range from 0.5-µm (micrometers) to 2-µm (micrometers), or equal to upper and lower ends of this range.

2. The method according to claim 1, wherein the substrate has a resistance greater than 3-kΩ (kilo-Ohms).

3. The method according to claim 1, wherein forming of an oxide layer at the surface of the substrate includes forming the oxide layer having a thickness within a range from 5-nm (nanometers) to 30-nm (nanometers), or equal to upper and lower ends of the range.

4. The method according to claim 1, wherein the laser annealing includes utilizing a laser with a power in the order of 4 J/cm² (Joules per centimeter squared).

5. The method according to claim 1, wherein the substrate is made of silicon, and the first atoms are silicon atoms.

6. The method according to claim 1, wherein the substrate is made of gallium nitride, and the first atoms are gallium nitride atoms.

7. The method according to claim 1, wherein the laser annealing includes utilizing a laser having a wavelength in a range from 300-nm (nanometers) to 700-nm, or equal to upper and lower ends of the range.

8. The method according to claim 1, wherein forming the first defect layer and forming the second defect layer includes melting the substrate to the first thickness.

9. A method of forming a radio frequency device, comprising:

forming an oxide layer at a surface of a substrate;

forming a charge carrier layer of the substrate and a void layer of the substrate, forming the charge carrier layer and the void layer including:

forming a melted portion of the substrate at the surface of the substrate by exposing the oxide layer at the surface of the substrate to a laser; and cooling the substrate and the melted portion of the substrate at the surface of the substrate, the cooling of the substrate and the melted portion of the substrate further includes:

forming the void layer containing defects of a void type configured to, in operation, trap possible charge carriers present within the void layer, the void layer being in a crystalline state, and the void layer being on a first portion of the substrate; and forming the charge carrier layer containing defects of complex types configured to, in operation, trap possible charge carriers in the charge carrier layer, the charge carrier being in an amorphous state, and the charge carrier layer being on the void layer;

forming an insulating layer on the charge carrier layer; and forming at least one the radio frequency component on the insulating layer, wherein:

forming the charge carrier layer further includes forming the charge carrier layer containing defects of the complex type, the defects of the complex type include first complexes between carbon atoms and silicon atoms and second complexes between the carbon atoms and oxygen atoms, a first thickness of the charge carrier layer and a second thickness of the void layer are in a range from 0.5-µm (micrometers) to 2-µm (micrometers), or equal to upper and lower ends of this range, and the charge carrier layer has a first concentration of oxygen atoms greater than a second concentration of oxygen atoms in the substrate, and the void layer has a third concentration of oxygen less than the first concentration of oxygen.

10. The method of claim 9, wherein:

forming the melted portion of the substrate at the surface of the substrate by exposing the oxide layer at the surface of the substrate to the laser further includes diffusing oxygen atoms present within the oxide layer through the melted portion.

11. A method of forming a radio frequency device, comprising:

forming a first insulating layer at a surface of a substrate by oxidizing a first portion of the substrate at the surface of the substrate;

laser annealing the first insulating layer at the surface of the substrate with a laser, laser annealing the first insulating layer provides a source of oxygen in forming a charge carrier layer of the substrate and a void layer of the substrate, forming the charge carrier layer and the void layer including:

forming a melted portion of the substrate at the surface of the substrate by exposing the first insulating layer at the surface of the substrate to the laser diffusing respective oxygen from the source of oxygen to a first thickness; and cooling the substrate and the melted portion of the substrate at the surface of the substrate forming the charge carrier layer having first defects including first complex types between carbon atoms and silicon atoms and second complex types between carbon atoms and oxygen atoms, and the first defects configured to, in operation, trap possible charge carriers present within the charge carrier layer;

while cooling the substrate and the melted portion, transforming a second portion of the substrate that remains in crystalline form and is not melted underlying the melted portion of the substrate forming the void layer of a second thickness, and transforming the melted portion to be in an amorphous form and overlying the void layer forming the charge carrier layer on the void layer, the charge carrier layer being separated from a third portion of the substrate by the void layer, and the charge carrier having the first thickness, the void layer configured to, in operation, trap possible charge carriers within the void layer; forming a second insulating layer on the charge carrier layer; and forming the radio frequency component on the second insulating layer, and wherein:

the first thickness is in a range from 0.5-µm (micrometers) to 2-µm (micrometers), or equal to upper and lower ends of this range; and the second thickness is in a range from 0.5-µm (micrometers) to 2-µm (micrometers), or equal to upper and lower ends of this range.

12. The method of claim 11, wherein the laser has a wavelength in a range from 300-nm (nanometers) to 700-nm (nanometers) or equal to upper and lower ends of the range.

13. The method of claim 11, wherein the substrate has a thickness in a range from 300-μm (micrometers) to 800-μm (micrometers), or equal to upper and lower ends of the range.

14. The method of claim 11, wherein the first insulating layer has a thickness in a range from 5-nm (nanometers) to 30-nm (nanometers), or equal to upper and lower ends of the range.

15. The method of claim 11, wherein the first thickness of the void layer is equal to the second thickness of the charge carrier layer.

16. The method of claim 15, wherein the first thickness of the void layer is different than the second thickness of the charge carrier layer.

17. The method of claim 11, wherein the laser annealing of the first insulating layer further includes pulsing the laser utilized in the laser annealing of the first insulating layer.

18. The method of claim 9, wherein the oxide layer has a thickness in a range from 5-nm (nanometers) to 30-nm (nanometers), or equal to upper and lower ends of the range.

19. The method of claim 10, further comprising forming the melted portion of the substrate at the surface of the substrate by exposing the oxide layer at the surface of the substrate to the laser further includes diffusing oxygen atoms present within the oxide layer through the melted portion to the first thickness.

20. The method of claim 9, wherein the laser annealing includes utilizing a laser having a wavelength in a range from 300-nm (nanometers) to 700-nm, or equal to upper and lower ends of the range.

\* \* \* \* \*

UNITED STATES PATENT AND TRADEMARK OFFICE
CERTIFICATE OF CORRECTION

PATENT NO. : 12,261,059 B2  
APPLICATION NO. : 17/880473  
DATED : March 25, 2025  
INVENTOR(S) : Patrick Hauttecoeur Page 1 of 1

It is certified that error appears in the above-identified patent and that said Letters Patent is hereby corrected as shown below:

In the Claims

Column 7, Claim 9, Line 64:
"forming at least one the radio frequency"
Should read:
--forming the radio frequency--.

Signed and Sealed this
First Day of July, 2025

Coke Morgan Stewart
*Acting Director of the United States Patent and Trademark Office*